US008862935B2

(12) United States Patent
Das et al.

(10) Patent No.: US 8,862,935 B2
(45) Date of Patent: Oct. 14, 2014

(54) INTEGRATED CIRCUIT WITH ERROR REPAIR AND FAULT TOLERANCE

(71) Applicant: ARM Limited, Cambridge (GB)

(72) Inventors: Shidhartha Das, Cambridge (GB); David Michael Bull, Balsham (GB); Emre Ozer, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/143,352

(22) Filed: Dec. 30, 2013

(65) Prior Publication Data

US 2014/0115377 A1    Apr. 24, 2014

Related U.S. Application Data

(63) Continuation of application No. 14/079,276, filed on Nov. 13, 2013, which is a continuation of application No. 12/735,339, filed as application No. PCT/GB2008/004301 on Dec. 29, 2008, now Pat. No. 8,621,272.

(30) Foreign Application Priority Data

Feb. 26, 2008  (GB) ................................ 0803491.0

(51) Int. Cl.
```
G06F 11/00      (2006.01)
G06F 11/07      (2006.01)
G06F 11/16      (2006.01)
G06F 11/10      (2006.01)
G01R 31/3181    (2006.01)
```

(52) U.S. Cl.
CPC ........ *G06F 11/0793* (2013.01); *G06F 11/1608* (2013.01); *G06F 11/1076* (2013.01); *G01R 31/31816* (2013.01)

USPC ............................................... 714/11; 714/10

(58) Field of Classification Search
None
See application file for complete search history.

(56) References Cited

U.S. PATENT DOCUMENTS

| 6,938,183 | B2 | 8/2005 | Bickel |
| 7,134,047 | B2 | 11/2006 | Quach |
| 7,337,356 | B2 | 2/2008 | Mudge et al. |
| 7,340,643 | B2 | 3/2008 | Grochowski et al. |
| 8,621,272 | B2 | 12/2013 | Das et al. |
| 2003/0043800 | A1* | 3/2003 | Sonksen et al. ............... 370/389 |
| 2003/0182542 | A1 | 9/2003 | Davies et al. |

(Continued)

FOREIGN PATENT DOCUMENTS

| GB | 2 431 258 | 4/2007 |
| WO | WO 2004/084072 | 9/2004 |
| WO | WO 2006/115474 | 11/2006 |

OTHER PUBLICATIONS

U.S. Appl. No. 14/079,276, filed Nov. 13, 2013; Inventor: DAS et al.

(Continued)

*Primary Examiner* — Yolanda L Wilson
(74) *Attorney, Agent, or Firm* — Nixon & Vanderhye P.C.

(57) ABSTRACT

An integrated circuit is provided with error detection circuitry and error repair circuitry. Error tolerance circuitry is responsive to a control parameter to selectively disable the error repair circuitry. The control parameter is dependent on the processing performed within the circuit. For example, the control parameter may be generated in dependence upon the program instruction being executed, the output signal value which is in error, the previous behavior of the circuit or in other ways.

7 Claims, 7 Drawing Sheets

(56) References Cited

U.S. PATENT DOCUMENTS

| | | | |
|---|---|---|---|
| 2004/0123201 A1 | 6/2004 | Nguyen et al. | |
| 2005/0108509 A1 | 5/2005 | Safford et al. | |
| 2006/0143551 A1 | 6/2006 | Biswas et al. | |
| 2006/0282702 A1 | 12/2006 | Bando et al. | |
| 2006/0291475 A1 | 12/2006 | Cohen | |
| 2007/0283193 A1* | 12/2007 | Lewis et al. | 714/48 |
| 2008/0141043 A1* | 6/2008 | Flynn et al. | 713/193 |
| 2010/0191911 A1* | 7/2010 | Heddes et al. | 711/118 |

OTHER PUBLICATIONS

U.S. Appl. No. 12/735,339, filed Jul. 7, 2010; Inventor: DAS et al. (USP 8,621,272).

Office Action mailed Sep. 17, 2012 in U.S. Appl. No. 12/735,339.

Office Action mailed Feb. 11, 2013 in U.S. Appl. No. 12/735,339.

International Preliminary Report on Patentability dated Sep. 10, 2010 for PCT/GB2008/004301.

International Search Report for PCTGB2008/004301, mailed Apr. 17, 2009.

Written Opinion of the International Searching Authority for PCT/GB2008/004301, mailed Apr. 17, 2009.

UK Search Report for GB0803491.0 dated May 8, 2008.

Das, S. et al., "A Self-Tuning DVS Processor Using Delay-Error Detection and Correction", VLSI Circuits Digest of Technical Papers, (Jun. 16, 2005), pp. 258-261.

Ernst, D. et al., "Razor: A Low-Power Pipeline Based on Circuit-Level Timing Speculation", Mircoarchitecture, Micro-36, (Dec. 2003), pp. 7-18.

Breuer, M.A., "Multi-media Applications and Imprecise Computation" 8$^{th}$ EUROMICRO Conference on Digital System Design, DSD '05, (2005), 6 pages.

Li, X. et al., "Application-Level Correctness and its Impact on Fault Tolerance", High Performance Computer Architecture, (Feb. 2007), 12 pages.

* cited by examiner

INTEGRATED CIRCUIT WITH ERROR REPAIR AND FAULT TOLERANCE

This application is a continuation application of U.S. patent application Ser. 14/079,276, filed Nov. 13, 2013, which is a continuation application of U.S. patent application Ser. No. 12/735,339, filed Jul. 7, 2010, now U.S. Pat. No. 8,621,272, which is the U.S. national phase of International Application No. PCT/GB2008/004301, filed Dec. 29, 2008, which designated the U.S. and claims priority to GB Patent Application No. 0803491.0, filed Feb. 26, 2008, the entire contents of each of which are hereby incorporated by reference in this application.

This invention relates to the field of integrated circuits. More particularly, this invention relates to the field of integrated circuits with built-in error detection and repair mechanisms.

It is known from PCT Publish Patent Application WO-A-2004/084072 to provide an integrated circuit with built-in error detection and repair mechanisms. The use of these repair mechanisms facilitates higher performance (e.g. a higher clock frequency, a lower operating voltage, etc) by reducing the need to provide a large operating margin to ensure that errors will not occur. These error detection and error repair mechanisms exploit the realisation that the circuit overhead for the provision of these mechanisms and the time and energy consumed in their use is more than compensated for by their ability to reduce the operating margin. Furthermore, these mechanisms provide a way of dealing with the increasing levels of process variability arising as integrated circuit geometries become smaller and accordingly avoiding the need to use increased operating margins.

Whilst the above error detection and error repair mechanisms are advantageous, there is never-the-less time and energy consumed in repairing errors that have been detected. The normal design practice within the field of integrated circuits is that errors cannot be tolerated and accordingly all errors that are detected (e.g. timing errors) must be repaired.

At the level of application programs it has been recognised that programs dealing with multimedia, artificial intelligence, and some SPECInt2000 programs are fault tolerant at the application level meaning that they produce acceptable results even though the results are inexact and/or approximations.

US-A-2006/0143551 describes a method of detecting and correcting an error by detecting the error in a circuit coupled to a first stage of a semiconductor device, and correcting the error in the circuit using valid data present in the circuit. The circuit may be a scan cell, in some embodiments. In such manner, errors may be corrected locally, minimizing the impact of the error on performance and power consumption. Other embodiments are described and claimed. If it is determined based on sensor data that soft errors are unlikely to occur, the processor may cause scan cells or other error detection/correction circuitry to be disabled to reduce power consumption.

Viewed from one aspect the present invention provides an integrated circuit comprising:

first processing circuitry responsive to an input signal to perform processing to generate an output signal;

second processing circuitry coupled to said first processing circuitry and responsive to said output signal to perform further processing;

error detecting circuitry responsive to said output signal to detect errors in said output signal at a time after said second processing circuitry has started to perform said further processing using said output signal;

error repair circuitry responsive to an error in said output signal detected by said error detecting circuitry to perform an error repair operation; and error tolerance circuitry coupled to said error repair circuitry and responsive to a control parameter selectively to disable said error repair circuitry such that said error repair operation is not performed; wherein said control parameter is dependent on at least one of said processing performed by said first processing circuitry and said further processing performed by said second processing circuitry.

The present technique recognises that the concept of error tolerance can be selectively applied within integrated circuits having error detection and error repair circuitry. There are some types of processing that generate signal values in which it is possible to tolerate errors, and accordingly the error repair circuitry can be selectively disabled in such circumstances using a control parameter. Thus, even at the signal level on an integrated circuit error tolerance can be utilised and has the advantage of reducing the performance impact (such as increased processing delay and increased energy consumption) that would otherwise be incurred in repairing such errors. For other types of processing, in which errors are more critical to the operation of the integrated circuit, the control parameter would be set to indicate that errors should be repaired. By determining whether or not it is necessary to repair errors in dependence upon the semantics of the processing being performed by the first and second processing circuitry, the present technique reduces the system resources required without adversely affecting the results of processing.

As examples of good candidates for acceptable error tolerance it will be appreciated that types of processing that generate output signals representing data signals are likely to be more error tolerant (e.g. a data signal representing an output audio level or an output pixel value will not cause particular problems if it is in error as this will likely appear merely as a small amount of increased noise in these signals). In contrast, processes that generate control signals or address signals are less error tolerant and accordingly it is less appropriate to disable the error repair circuitry when handling such output signals.

The selected disabling of the repair circuitry can be conveniently performed under program control by setting of a fault-tolerance mode flag within a mode register. In this way, a programmer can selectively enable and disable error repair for certain instructions as the programmer will likely be well aware of the type of processing being performed and the nature of the data being processed, and accordingly whether or not the processing is error tolerant. Thus, for high volumes of media data being processed the error repair circuitry can be disabled as errors within this data can be relatively well tolerated.

In other embodiments the control parameter may be set under control of a state machine to match an operating mode of the first and second processing circuitry.

Whilst it is possible that the error repair functionality could be enabled and disabled on a chip-wide basis, it is desirable in some embodiments to use a plurality of fault-tolerance mode flags to selectively enable and disable the error repair circuitry associated with different instances of processing circuitry within the integrated circuit. Thus, the error repair circuitry may be switched off within a SIMD engine likely to be performing the processing of high volumes of media data, while the error repair circuitry can remain enabled in a load store unit associated with the use of address signals or within control circuitry associated with the decoding of instructions and control of the integrated circuit.

The integrated circuit may also operate in a speculative mode in which architectural state of the processor is not updated and in which the error repair circuitry can be disabled by the control parameter.

The control parameter used to selectively disable the error repair circuitry may also take other forms. In some embodiments it is possible that the control parameter is dependent upon a program instruction corresponding to the processing being performed that results in the error. In this way, repair could be switched on and off on an instruction-by-instruction basis.

The control parameter may be a fault-tolerance field within the program instructions themselves in some embodiments. In other embodiments the control parameter may be derived based upon groupings of instructions within the instruction set, e.g. SIMD instructions, dedicated media processing instructions and the like may serve to switch off error repair whilst other types of instructions may switch on error repair.

Another way in which the control parameter serving to selectively disable the error repair circuitry may be derived is in dependence upon the output signal itself The output signal generated by the processing may be detected as being in error, but may never-the-less be determined to lie within acceptable limits where that error can be tolerated and accordingly the cost in terms of time and energy in repairing that error is not justified.

A fault-tolerated range associated with an output signal may comprise a range of normal values within a maximum possible range of values. In other embodiments the fault-tolerated range may be determined in dependence upon a temporally neighbouring value such that the error will not be repaired if it is within a certain amount of the preceding value (and/or in some embodiments a succeeding value).

Another way in which the control parameter for selectively disabling the error repair circuitry may be derived is by observing runs of errors within successive output signals. An isolated error may be tolerated and the error repair circuitry remain disabled, whereas a run of successive output signal values in error exceeding a threshold run length may serve to trigger the enabling of the error repair circuitry. Long runs of errors are unlikely to be tolerated and can have more than a simple cumulative effect upon a resulting output behaviour from the integrated circuit.

Another way in which the control parameter may be derived is based upon a determination of whether or not the output signal matches a predetermined format. It may be possible to tolerate errors where the format of the signal is correct even if the absolute value of a parameter being represented is in error. As an example, if a data stream is being assembled, then the signal protocol needs to be correct even if the data load may tolerate errors.

It will be appreciated that the error repair operations performed by the error repair circuitry can take a variety of different forms. In some embodiments the error repair operation will include flushing a processing pipe line either partially or whole. In other embodiments the repair operations may include correcting the further processing performed by the second processing circuitry using the output signal value, such as, for example, by passing the corrected output signal to this second processing circuitry and providing sufficient extra time for the correct outputs to be generated therefrom.

A further feature which may optionally be provided in some embodiments is the generation of a substitute output signal in place of an output signal that is in error. As an example, when it is detected by the error detecting circuitry that the output signal value is incorrect, the cost in terms of time and energy in regenerating that output signal to have its correct value is too high and accordingly the error repair circuitry will be disabled. However, improved error tolerance is achieved by substituting a "safe" output signal value in place of the output signal value that is in error. The "safe" output signal value is not correct in that it's not guaranteed to represent the output signal that would be obtained by regeneration using the first processing circuitry, but never-the-less the "safe" output signal value will more likely be tolerated as an error than the erroneous output signal value that could be significantly outside the normal acceptable range.

In this context the substitute output signal could be derived from temporally neighbouring values of the output signal e.g. a previous known good value of the output signal could be held and used in place of the output signal value that is in error. Other substitution strategies are also possible.

It will be appreciated that the error detecting circuitry can function in a variety of different ways. One advantageously low overhead way of providing error detection is to detect a change in a value of the output signal during a predetermined period as being indicative of an error. In the design of integrated circuits, it is conventional to establish a time by which output signals should have properly reached their correct value subsequent to processing and propagation through preceding circuitry. A change in value of an output signal subsequent to this time can be taken to indicate an error, e.g. a timing error. The predetermined period during which such a change is detected can extend beyond the period at which the subsequent processing circuitry starts using an output signal value based upon the speculative assumption that it was correct.

Viewed from another aspect the present invention provides an integrated circuit comprising:

first processing means for performing processing to generate an output signal in response to an input signal;

second processing means for performing further processing in response to said output signal, said second processing means being coupled to said first processing means;

error detecting means for detecting errors in said output signal at a time after said second processing means has started to perform said further processing using said output signal;

error repair means for performing an error repair operation in response to an error in said output signal detected by said error detecting means; and error tolerance means for selectively disabling said error repair circuitry in response to a control parameter such that said error repair operation is not performed; wherein said control parameter is dependent upon at least one of said processing performed by said first processing means and said further processing performed by said second processing means.

Viewed from a further aspect the present invention provides a method of operating an integrated circuit comprising the steps of:

performing processing to generate an output signal in response to an input signal using first processing circuitry;

performing further processing in response to said output signal using second processing circuitry coupled to said first processing circuitry;

detecting errors in said output signal at a time after said second processing circuitry has started to perform said further processing using said output signal;

performing an error repair operation in response to an error in said output signal using error repair circuitry; and in response to a control parameter, selectively disabling said error repair circuitry such that said error repair operation is not performed; wherein said control parameter is dependent on at least one of said processing performed by said first processing circuitry and said further processing performed by said second processing circuitry.

Example embodiments will now be described, by way of example only, with reference to the accompanying drawings which;

FIG. 1 schematically illustrates a register between pipeline stages within an integrated circuit including error detection circuitry and error repair circuitry;

Figure 4:
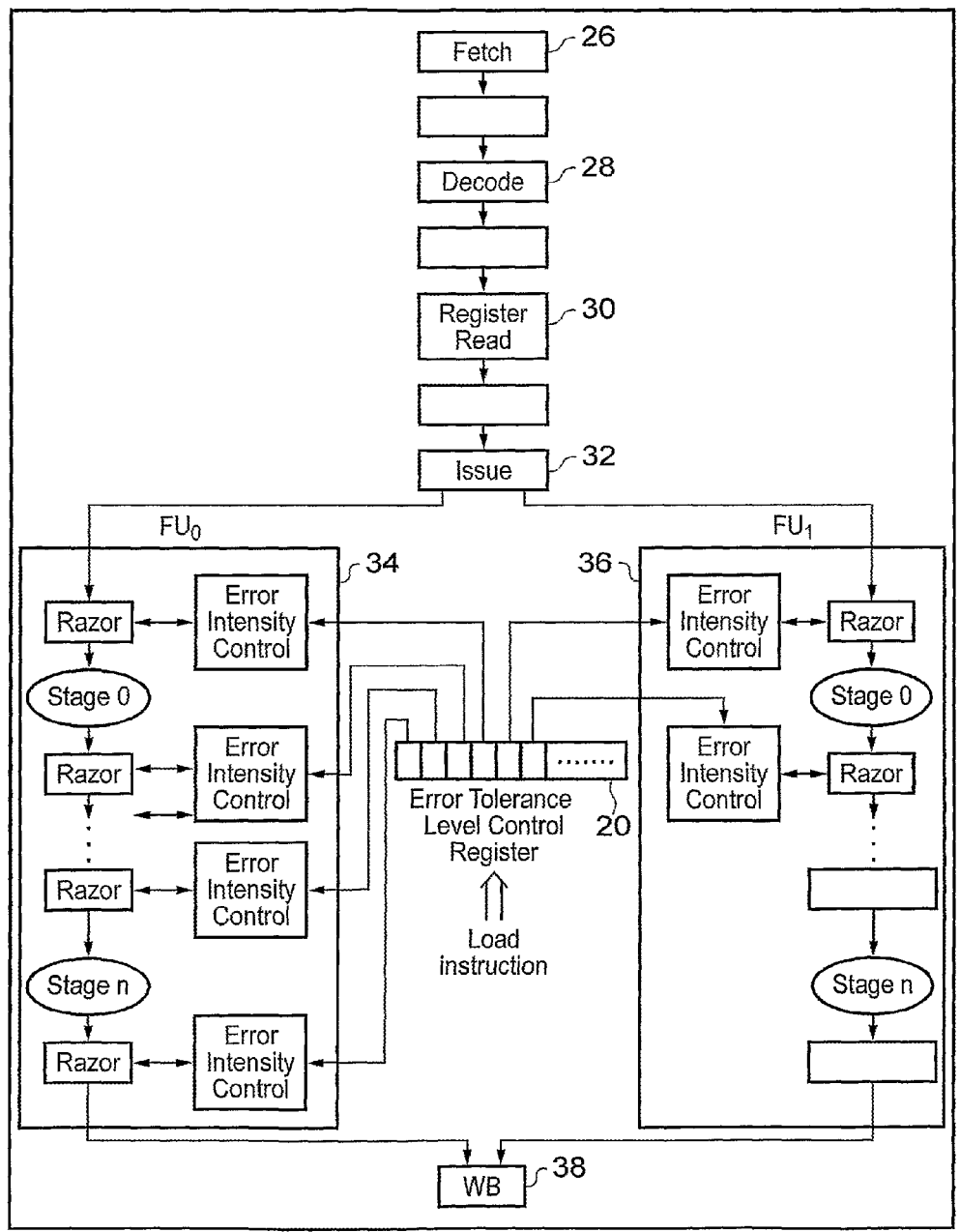
Figure 5:
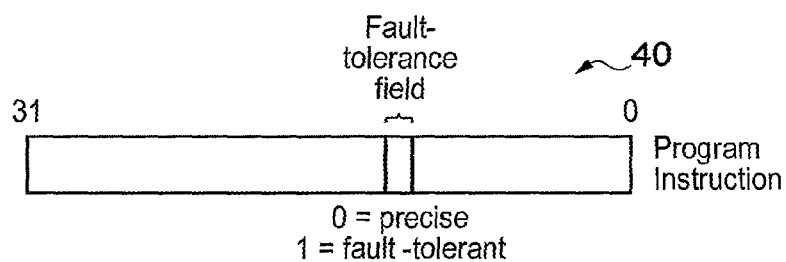
Figure 6:
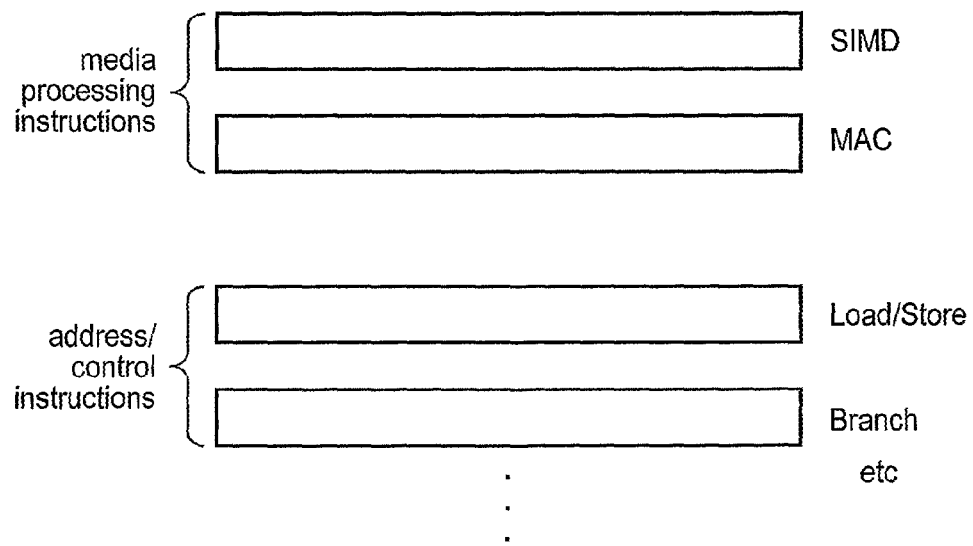
Figure 7:
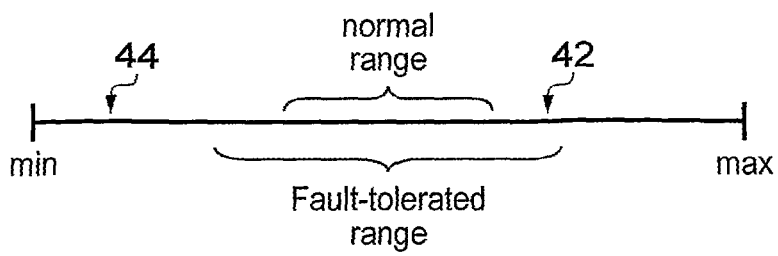
Figure 8:
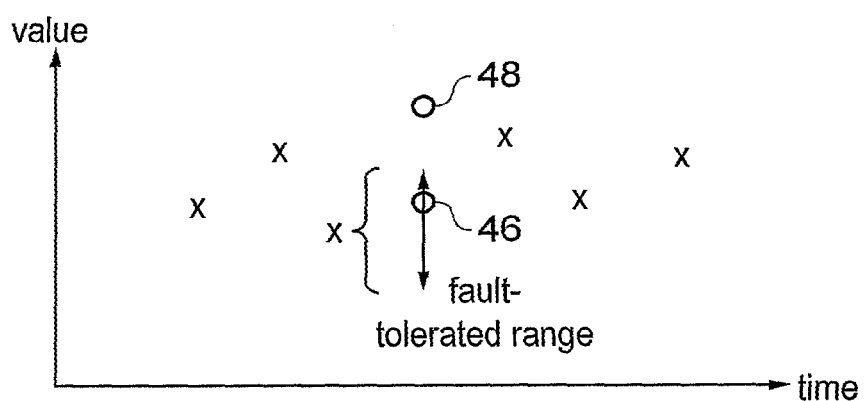
Figure 9:
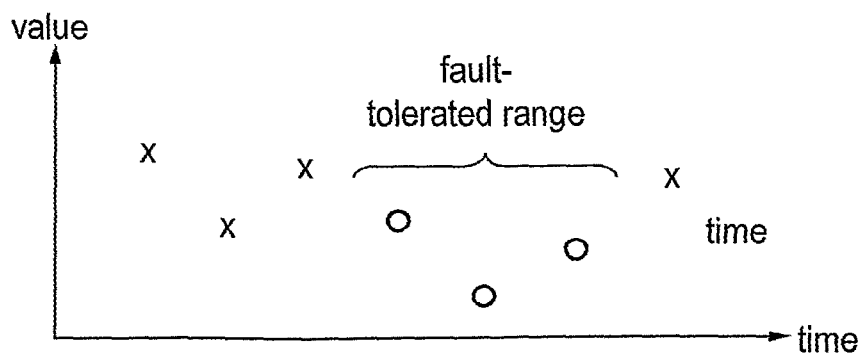
Figure 10:
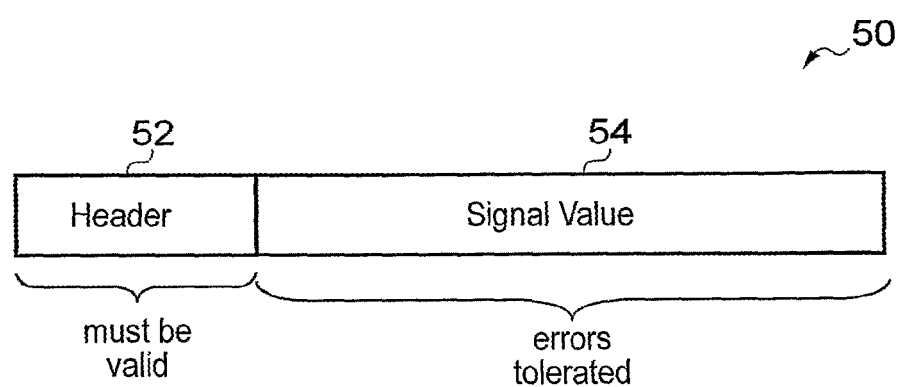
Figure 11:
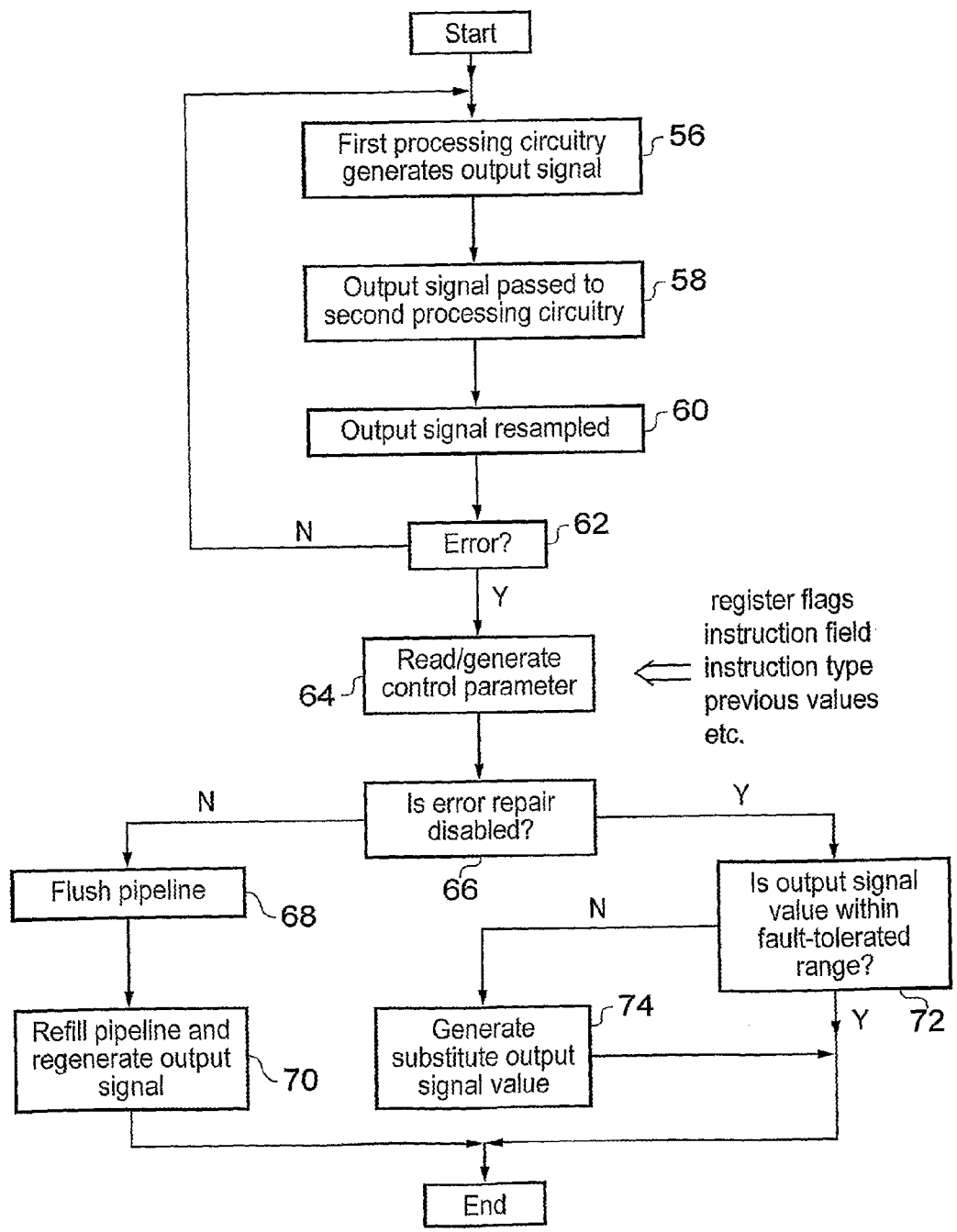

FIG. 4 schematically illustrates multiple pipeline stages each with respective error tolerance circuitry and fault-tolerance mode flags;

FIG. 5 schematically illustrates a program instruction including a fault-tolerance field indicating whether or not error repair circuitry is to be active in the processing of that program instruction;

FIG. 6 schematically illustrates different types of program instructions from an instruction set which can be grouped into a group for which the error repair circuitry is disabled and a group for which the error repair circuitry is not disabled;

FIGS. 7, 8, and 9 schematically illustrate how an output signal that is in error may fall within a fault-tolerated range for which the error repair circuitry can remain disabled;

FIG. 10 schematically illustrates an output signal in the form of a word of data including a header portion and a signal value portion that have different tolerances to errors; and FIG. 11 is a flow diagram schematically illustrating the operation of the above techniques in selectively disabling error repair circuitry.

Figure 1:
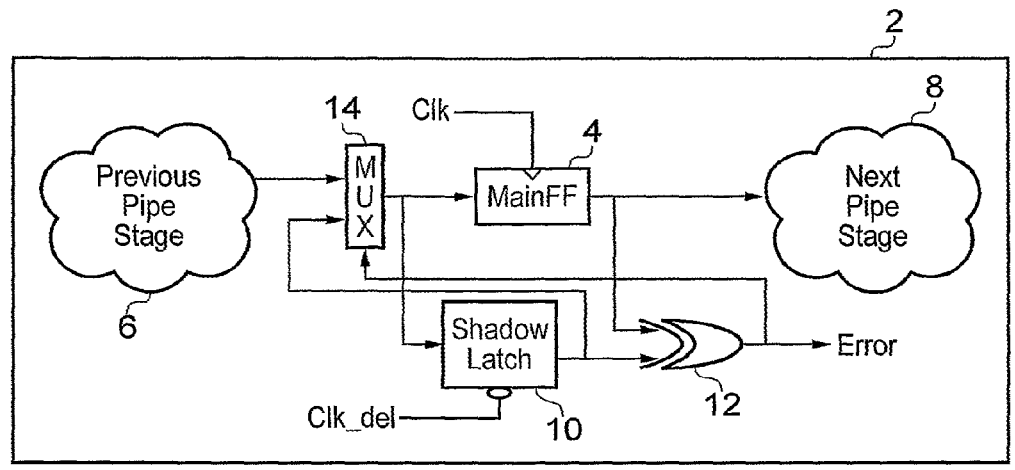

FIG. 1 illustrates an integrated circuit 2 containing a register (latch or storage element) 4 connected to receive output signals from first processing circuitry 6 and supply those output signals to second processing circuitry 8. The first processing circuitry 6 and the second processing circuitry 8 form sequential pipeline stages within a processing pipeline. Associated with the register 4 is a shadow latch 10 which is controlled by a delayed version Clk-del of the clock Clk which controls the register 4. Accordingly, the shadow latch 10 serves to sample and store a value being generated by the first processing circuitry 6 as the output signal at a time subsequent to the capture of the output signal by the register 4. The output signal captured by the register 4 is applied to the second processing circuitry 8 before the shadow latch 10 has re-sampled the output signal generated by the first processing circuitry 6. The difference between the time at which the register 4 and the shadow latch 10 sample the output signal from the first processing circuitry 6 represents a predetermined period and any change in the output signals that are captured is indicative of an error.

The most likely error is that the processing of the first processing circuitry 6 had not completed when the output signal was captured by the register 4 and accordingly the output signal changed subsequent to this capture as the processing finished. It is also possible that a false-positive error is detected and that the output signal registered by the register 4 is correct and the value stored within the shadow latch 10 is the result of noise or some other random variation (such false-positives should be rare). An exclusive-OR gate 14 determines if there is a difference between the output signal values within the register 4 and the shadow latch 10. If there is such a difference, then an error signal is generated. The error signal controls a multiplexer 14 which switches the value for the output signal stored in the shadow latch 10 into the path where it can be stored within the register 4 thereby correcting (error repairing) the erroneous value originally stored within the register 4.

The error signal from the exclusive-OR gate 12 also is applied elsewhere within the pipeline so as to correct the processing being performed by the second processing circuitry 8 (e.g. stretching the clock cycle to give sufficient time for the corrected output signal within the register 4 to be processed) and performing a pipeline flush either partially or totally. These techniques are known and described in PCT Publish Patent Application WO-A-2004/084072. The disclosure of this earlier patent is incorporated herein in its entirety.

Figure 2:
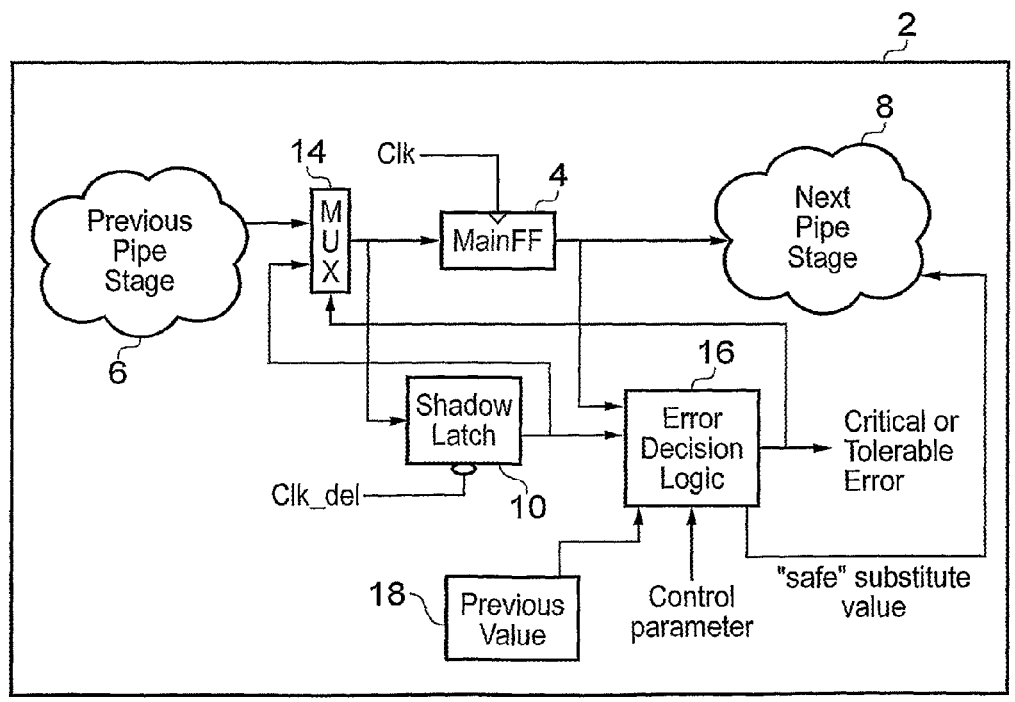
FIG. 2 illustrates a register between pipeline stages within an integrated circuit additionally including error tolerance circuitry for selectively disabling error repair.

FIG. 2 illustrates an integrated circuit 2 including error tolerance circuitry 16. When a difference is detected between the output signals stored within the register 4 and the shadow latch 10 (an error is detected), then the error tolerance circuitry 16 determines in dependence upon a control parameter (and optionally other parameters supplied thereto) whether or not error repair is to be performed in respect of the detected error. The control parameter is set in accordance with the processing performed by the pipe stages 6, 8. If the control parameter indicates that error repair is to be performed, then the error that has been detected is a critical error and an error signal is fed back to the multiplexer 14 in a way similar to that of FIG. 1 as well as propagated elsewhere within the integrated circuit 2 to trigger error repair operations. However, if the error tolerance circuitry 16 determines that the error that has been detected is a tolerable error, then no such error signal will be generated and the error repair circuitry will remain disabled despite the detection of the error in the output signal of the first processing circuitry 6.

Illustrated in FIG. 2 is a "safe" substitute value that can optionally be generated by the error tolerance circuitry 16 and supplied to the second processing circuitry 8 in place of the output signal from the register 4 which has been determined to be an error. This substitute value is chosen to be a value less likely to cause further errors in processing, or significant degradation of the processing results. The substitute value can be supplied downstream of the point at which the output signal from the register 4 is applied to the second processing circuitry 8.

Also illustrated in FIG. 2 is a register 18 in which a previous value of the output signal for a previous processing cycle can be stored and supplied to the error tolerance circuitry 16. This previous value register can be used in a number of ways. It is possible that in some embodiments the substitute value can be taken from this previous value register with this previous value being supplied in place of an erroneous output signal when an error is detected. An alternative use of the value from the previous value register 18 is to determine whether or not error repair should be performed in respect of a detected error. If the captured erroneous output signal has a value too different from the previous value stored within the previous value register 18, then error repair may be appropriate. Alternatively, if the erroneous output signal value is relatively close to the previous value stored within the previous value register 18, then error repair may not be justified and the time and energy it would consume can be saved by disabling the error repair circuitry. The previous value register 18 may in some embodiments store multiple previous values (and the error status of these values) for use in determining whether or not error repair should be disabled as will be described later.

Figure 3:
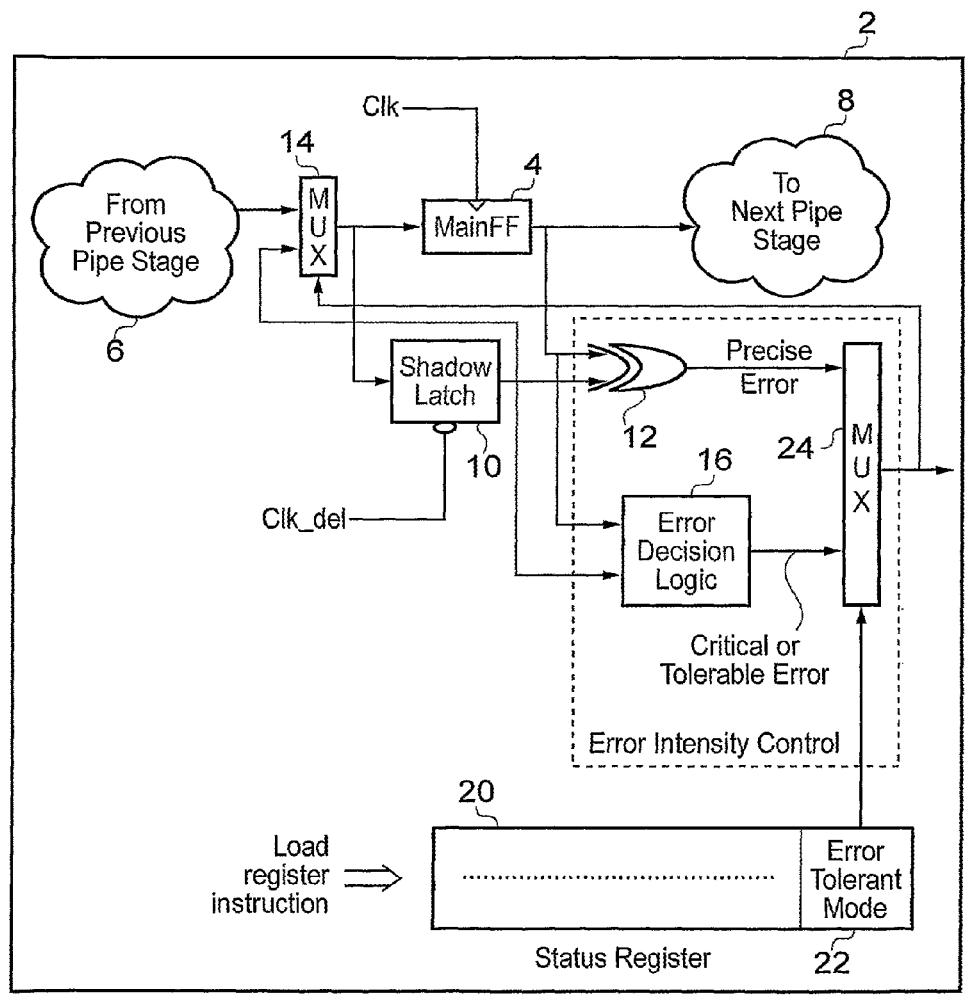
FIG. 3 illustrates a modification of FIG. 2 including a mode register storing a fault-tolerance mode flag for controlling the disabling of the error repair circuitry.

FIG. 3 schematically illustrates an integrated circuit 2 similar to that illustrated in FIG. 2. In this example embodiment the exclusive-OR gate is retained as this generates a precise error signal which can be directly used when error tolerance is not being supported. A mode register 20 is provided and is loaded under program instruction control with flag values including a fault-tolerance flag 22. This fault-tolerance flag 22 controls a multiplexer 24 which either uses the precise error signals generated by the exclusive-OR gate 12 or the critical/tolerable error signal generated by the error tolerance circuitry 16 in dependence on whether or not error tolerance is currently active.

It will be appreciated that this setting of the fault-tolerance mode flag under program control allows a programmer to turn on and turn off the error repair capability of the integrated circuit 2 for different portions of the program code and for different program instructions. Thus, a programmer will know that they are executing a large block of program instructions manipulating data values within which error tolerance can be supported. Accordingly, before such program instructions manipulating data values are executed, the fault-tolerance mode flag can be set to permit error repair to be disabled. At the end of processing such a block of program instructions manipulating data values (which may be very lengthy in terms of time) the fault-tolerance mode flag can be switched off and accordingly the error repair circuitry become active in response to an error signal generated by the exclusive-OR gate 12.

The processor may also have a speculative mode of processing (analogous to privileged or user mode) in which the architectural state of the processor or system is not updated by the processing activity and in which the error repair circuitry can be disabled by the control parameter. As architectural state is not being updated, the errors will not affect the correctness, and therefore repair is not necessary.

In an alternative embodiment an application specific integrated circuit (which is not necessarily programmable) may use the same hardware in different modes and a state machine may switch on and off the error repair capability to match the mode. For example, an ASIC may contain a datapath including an adder which in one mode calculates addresses for memory accesses and in another mode data values. The state machine may switch on the error repair during address generation and switch it off during the less critical data value generation.

FIG. 4 illustrates a further embodiment of an integrated circuit 2 showing multiple stages of a general purpose processor pipeline. These include a fetch stage 26, a decode stage 28, a register read stage 30, an issue stage 32, and a plurality of stages 0 . . . n in each of two functional units 34, 36, as well as a write back stage 38. Registers for storing output signals of these respective stages are provided therebetween and some of these registers are provided with the error detection and error repair circuitry previously discussed. In this example, error detection and error repair circuitry is provided within the functional units 34, 36. Each of these error detection and error repair circuitry elements has an associated fault-tolerance flag within a mode register 20 and these flags are used to selectively enable and disable the repair circuitry associated with the different pipeline stages within the functional units 34, 36. This provides a high degree of granularity in the disabling and enabling of error repair under program control.

FIG. 5 schematically illustrates a program instruction 40. This program instruction includes a fault-tolerance field in the form of one bit. Depending upon the value of this fault-tolerance field, the error tolerance circuitry 16 will either serve to enable or disable error repair in respect of the processing performed for that program instruction 40. In this way, error repair can be turned on and off on an instruction-by-instruction basis. It will be appreciated in this technical field that it is normal for control bits to propagate along a processing pipeline in conjunction with data values that are being manipulated for that program instruction. The fault-tolerance bit within the fault-tolerance field can be another control bit which is propagated along the processing pipeline to switch on and off the error repair circuitry in synchronism with the progress of that program instruction through the pipeline.

FIG. 6 illustrates different classes of instructions within an instruction set. Some instructions, such as SIMD (single instruction multiple data) and multiply accumulate (MAC) instructions, are generally associated with the processing of data such as multimedia data (video, audio) and accordingly it is possible in some embodiments that error repair is disabled when such program instructions are being processed. Conversely, another group of instructions, such as load store instructions, branch instructions and the like, are typically associated with the manipulation of address and control values. It is inappropriate to tolerate errors in the processing of such instructions and accordingly the error repair circuitry will remain enabled when such instructions are being processed. The class (group) of instructions to which an individual instruction belongs and can be identified at the decode stage 28 within a processing pipeline and passed as a control signal along the pipeline as previously discussed.

FIG. 7 illustrates one example of how the control parameter used to control the error tolerance circuitry 16 can be derived based upon the output signal itself The output signal can be determined to have an error, but may never-the-less have the value that falls within a fault-tolerated range such as the value at reference point 42 illustrated in FIG. 7. Such an output signal value can be allowed to continue without being error repaired as it is not too far removed from the normal range of output signal values and accordingly will likely produce relatively little perturbation in the overall operation. Conversely, an output signal value having a value as at reference point 44 in FIG. 7 is too far from the normal range and outside the fault-tolerated range and accordingly will serve as a control parameter to the error tolerance circuitry 16 which will result in the error repair circuitry being enabled to repair that output signal. It will be appreciated that the error tolerance circuitry will typically include comparators and the like in order to permit such range comparisons to be performed. Such comparators and range determinations will be familiar to those in this technical field.

FIG. 8 illustrates another example embodiment of how the processing output signal value itself can be used to form a control parameter for determining whether or not error repair is enabled or disabled. In this example, an output signal value in error is compared with a temporally preceding output signal value and providing it is within a fault-tolerated range thereof error repair is disabled. Thus, an output signal value that is in error and is at point 46 will not be repaired whereas an output signal value at point 48 will be repaired.

FIG. 9 schematically illustrates how a fault-tolerated range of behaviour can be based upon the repeated occurrence of errors. In some embodiments it may be appropriate to tolerate isolated errors in an output signal, but a sequence of more than a threshold number of successive output signal values in error should result in error repair. In the example illustrated in FIG. 9 a maximum of three successive output signal values that are in error is permitted and, if a fourth successive output signal values that is in error is detected, then error repair will be triggered.

FIG. 10 illustrates a still further way a control parameter for controlling whether or not error repair is disabled may be derived. In some integrated circuits words 50 may be generated with these words 50 including a header portion 52 and a signal value portion 54. The nature of the words may be such that their subsequent processing will not be possible if the header portion 52 is invalid, or misinformed, whereas an error within the signal value portion 54 may be tolerated. Accordingly, a control parameter for controlling whether or not error repair is invoked can be based upon whether or not the header portion 52 is valid, e.g. meets predetermined format characteristics. Comparison circuitry can be included within the error tolerance circuitry 16 in order to make this comparison of the header portion 52 against predetermined format parameters known to correspond to valid header portions 52.

FIG. 11 is a flow diagram schematically illustrating the above techniques. At step 56, the first processing circuitry generates an output signal. At step 58, the output signal generated by the first processing circuitry is passed to second processing circuitry which commences processing based thereon. At step 60, the output signal is resampled. The resampling of the output signal forms the end point of a predetermined period starting with the first sampling of the output signal. A difference between these sampled values is a change in the signal value during the predetermined period and is indicative of an error. In other embodiments it will be appreciated that a change detector could be used rather than double-sampling and comparison.

Step 62 in this example embodiment compares the original sample with the later sample value and if these differ an error is detected. If the values do not differ, processing returns to step 56. When an error is detected, step 64 reads or generates the control parameter which controls whether or not error repair is to be performed. The control parameter is set in dependence of the processing being performed. For example, the control parameter may be a simple fault-tolerance mode flag stored within a register. Alternatively, the control parameter may be generated upon the basis of the output signal value that is in error itself as well as one or more preceding output signal values or patterns of output signal values. The control parameter may also be based upon a program instruction resulting in the generation of the output signal that is in error, such as in dependence upon a field within a program instruction or a type of program instruction.

Step 66 determines whether or not error repair is disabled. If error repair is not disabled, then steps 68 and 70 serve to repair the error and perform a repair operation, such as a partial or total pipeline flush and the refilling of the pipeline to regenerate the output signal.

If the determination at step 66 was that error repair is disabled, processing proceeds to step 72. Step 72 determines whether or not the output signal value is within a fault-tolerated range of values. If the output signal value which is in error is not within this fault-tolerated range, then step 74 generates a substitute output signal value that is within a normal range. Steps 72 and 74 do not repair the error in the output signal as the true value of the output signal is not known. Rather steps 72 and 74 substitute a more acceptable value for the output signal value that is in error so as to reduce the disturbance produced by the error.

We claim:

1. An integrated circuit comprising:
   first processing circuitry configured to perform processing upon an input signal to generate an output signal;
   second processing circuitry coupled to said first processing circuitry and configured to perform further processing upon said output signal;
   error detecting circuitry configured to detect errors in said output signal at a time after said second processing circuitry has started to perform said further processing using said output signal; and
   error repair circuitry configured to respond to an error in said output signal detected by said error detecting circuitry to perform an error repair operation; wherein
   said input signal is a word within a data stream, said word comprising a header portion and a data load portion; and
   said error detection circuitry and said error repair circuitry are configured such that:
   (i) if said error is within said header portion, then said error is repaired; and
   (ii) if said error is within said data load portion, then said error is not repaired.

2. An integrated circuit as claimed in claim 1, comprising comparison circuitry configured to compare said header portion against predetermined format parameters corresponding to valid header portions to detect if said header portion includes an error.

3. An integrated circuit as claimed in claim 1, comprising error tolerance circuitry coupled to said error repair circuitry and configured to determine whether or not said output signal matches a predetermined format, said error tolerance circuitry disabling said error repair circuitry from repairing said error if said output signal matches said predetermined format.

4. An integrated circuit comprising:
   first processing means for performing processing upon an input signal to generate an output signal;
   second processing means for performing further processing upon said output signal, said second processing means coupled to said first processing circuitry;
   error detecting means for detecting errors in said output signal at a time after said second processing circuitry has started to perform said further processing using said output signal; and
   error repair means for performing an error repair operation in response to an error in said output signal detected by said error detecting means; wherein
   said input signal is a word within a data stream, said word comprising a header portion and a data load portion; and
   said error detection means and said error repair means are formed such that:
   (i) if said error is within said header portion, then said error is repaired; and
   (ii) if said error is within said data load portion, then said error is not repaired.

5. A method of operating an integrated circuit comprising the steps of:
   perform processing with first processing circuitry upon an input signal to generate an output signal;
   performing further processing upon said output signal with second processing circuitry coupled to said first processing circuitry;
   detecting errors in said output signal at a time after said second processing circuitry has started to perform said further processing using said output signal; and
   in response to an error in said output signal detected by said error detecting circuitry, performing an error repair operation; wherein
   said input signal is a word within a data stream, said word comprising a header portion and a data load portion; and
   said steps of detecting errors and said step of performing an error repair operation operate such that:
   (i) if said error is within said header portion, then said error is repaired; and (ii) if said error is within said data load portion, then said error is not repaired.

6. A method as claimed in claim 5, comprising the step of comparing said header portion against predetermined format parameters corresponding to valid header portions to detect if said header portion includes an error.

7. A method as claimed in claim 5, comprising the steps of determining whether or not said output signal matches a predetermined format and disabling said error repair circuitry from repairing said error if said output signal matches said predetermined format.

\* \* \* \* \*